(12) United States Patent
Sato (10) Patent No.: US 6,921,921 B2
(45) Date of Patent: Jul. 26, 2005

(54) LIGHT EMITTING MODULES

(75) Inventor: Masahiro Sato, Yokohama (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 37 days.

(21) Appl. No.: 10/646,815

(22) Filed: Aug. 25, 2003

(65) Prior Publication Data

US 2004/0042071 A1 Mar. 4, 2004

(30) Foreign Application Priority Data

Aug. 30, 2002 (JP) .................................... P2002-254408

(51) Int. Cl.[7] ............................................. H01L 27/15
(52) U.S. Cl. ......................... 257/81; 257/432; 257/82; 257/257; 257/433; 257/434
(58) Field of Search ........................... 257/81–82, 257, 257/432–434

(56) References Cited

U.S. PATENT DOCUMENTS 5,801,402 A * 9/1998 Shin ............................ 257/80
5,812,582 A * 9/1998 Gilliland et al. ............. 372/50
6,368,890 B1 * 4/2002 Wickstrom et al. .......... 438/29
6,483,864 B1 * 11/2002 Yuang et al. ................. 372/96
6,526,078 B2 * 2/2003 Lee ............................. 372/31
6,607,309 B2 * 8/2003 Kuhn et al. .................. 385/93

* cited by examiner

Primary Examiner—Luan Thai
(74) Attorney, Agent, or Firm—McDermott Will & Emery LLP (57) ABSTRACT

A light emitting module 10 is provided with a semiconductor light emitting device 21, a semiconductor light receiving device 22, a mount member 20 on which the semiconductor light emitting device 21 and semiconductor light receiving device 22 are mounted, a lens 32, and a lens holding member 30 for holding the lens 32. Part of light emitted by the semiconductor light emitting device 21 is reflected by a reflecting film 32c provided on a first surface 32a of the lens 32 to enter the semiconductor light receiving device 22. Therefore, the semiconductor light receiving device 22 can receive forward light from the semiconductor light emitting device 21, without using a half mirror.

18 Claims, 12 Drawing Sheets

LIGHT EMITTING MODULES

BACKGROUND OF THE INVENTION

1. Field of the Invention

The present invention relates to light emitting modules.

2. Related Background Art

There are various types of light emitting modules, which includes one having a semiconductor light emitting device, a semiconductor light receiving device, a lens, a stem, and a lens cap. This light emitting module is constructed in a configuration wherein the semiconductor light emitting device and the semiconductor light receiving device are mounted on the stem and wherein the lens cap holding the lens is placed on the stem so as to cover the semiconductor light emitting device and the semiconductor light receiving device.

Semiconductor light emitting devices to be mounted in such light emitting modules include two types of semiconductor light emitting devices: the edge emitting type and the surface emitting type. The edge emitting type semiconductor light emitting devices are of structure in which two end faces opposed to each other constitute a resonator and in which forward light is emitted through one end face and backward light through the other end face. In the surface emitting type semiconductor light emitting devices, a pair of semiconductor layer stacks arranged in the axial direction intersecting with a light emitting surface constitute a resonator, a surface on the opposite side to the light emitting surface serves as a fixing surface to the stem, and light is emitted from the light emitting surface. Namely, the surface emitting type semiconductor light emitting devices are of structure from which it is hard to take out the backward light.

SUMMARY OF THE INVENTION

With the light emitting modules as described above, there are demands for monitoring the forward light emitted from the semiconductor light emitting device, by the semiconductor light receiving device. In order to meet such demands, regardless of whether the semiconductor light emitting device is of either of the edge emitting type and the surface emitting type, it is necessary to dispose a half mirror between the semiconductor light emitting device and the lens and guide part of light separated by the half mirror, into the semiconductor light receiving device.

An object of the present invention is, therefore, to provide light emitting modules capable of monitoring the forward light emitted from the semiconductor light emitting device, by the semiconductor light receiving device.

A light emitting module according to the present invention comprises (a) a housing comprising a mount member and a lens holding member; (b) a semiconductor light emitting device mounted on the mount member; (c) a lens held by the lens holding member, the lens having a first surface which reflects part of light from the semiconductor light emitting device and transmits part of the light, and a second surface which outputs the light transmitted by the first surface; and (d) a semiconductor light receiving device mounted on the mount member and arranged to receive the reflected light from the first surface. The mount member has a support surface provided along a predetermined surface intersecting with a predetermined axis, a hole extending in a direction of the predetermined axis, and a lead terminal penetrating the hole, and the lens holding member is placed on the support surface of the mount member so as to cover the semiconductor light emitting device and the semiconductor light receiving device.

In the light emitting module according to the present invention, the light emitted from the semiconductor light emitting device is reflected in part and transmitted in part by the first surface of the lens. The light transmitted by the first surface emerges from the second surface of the lens. On the other hand, the reflected light from the first surface of the lens is incident into the semiconductor light receiving device. In this light emitting module, as described above, part of the light emitted from the semiconductor light emitting device passes through the lens to emerge from the second surface of the lens and part of the reflected light can be monitored by the semiconductor light receiving device.

The light emitting module of the present invention is preferably configured as follows: the light emitting module further comprises an optical fiber optically directly coupled to the second surface of the lens and held by the housing; the semiconductor light emitting device comprises a surface emitting type semiconductor laser; the first surface and the second surface of the lens are convex surfaces; the light emitting surface of the semiconductor light emitting device is optically directly coupled to the first surface of the lens; one end of the optical fiber is optically directly coupled to the second surface of the lens; and the lens has a reflecting film capable of reflecting part of the light from the semiconductor light emitting device and transmitting part of the light, on the first surface.

According to the present invention, it is feasible to provide the light emitting module that transmits the light emerging from the second surface of the lens through the fiber. The semiconductor light receiving device is able to receive the light from the light emitting surface of the semiconductor light emitting device, without using such an optical component as a half mirror. Since the reflecting film is provided on the first surface of the lens, it is feasible to increase the intensity of the light incident into the semiconductor light receiving device after reflected by the reflecting film.

DESCRIPTION OF THE PREFERRED EMBODIMENTS

The light emitting modules according to embodiments of the present invention will be described below. In the following description of the embodiments, the same reference symbols will denote the same components throughout the drawings as much as possible, for easier understanding of the description.

Figure 1:
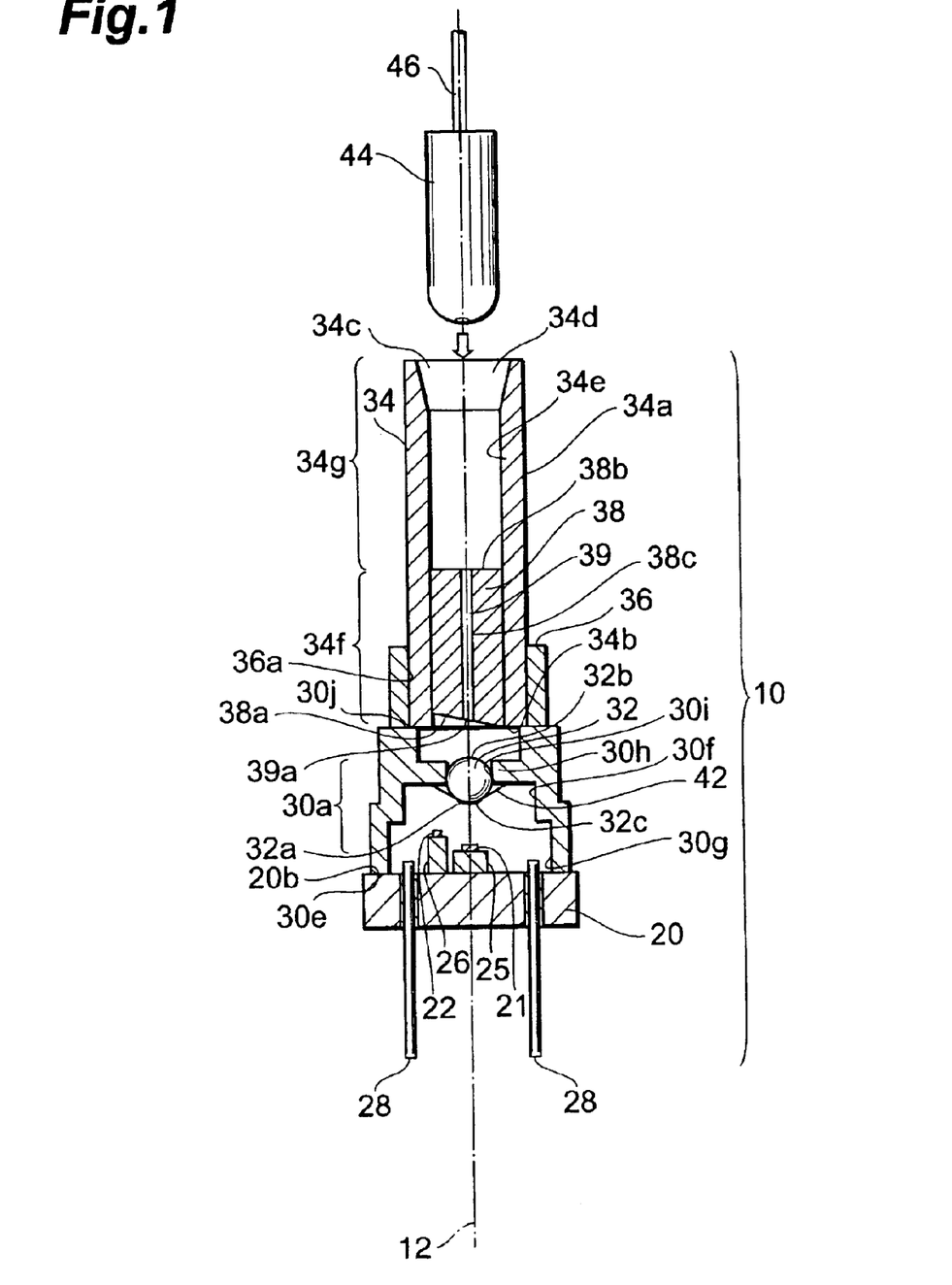
FIG. 1 is a sectional view of the light emitting module according to the first embodiment.
Figure 2:
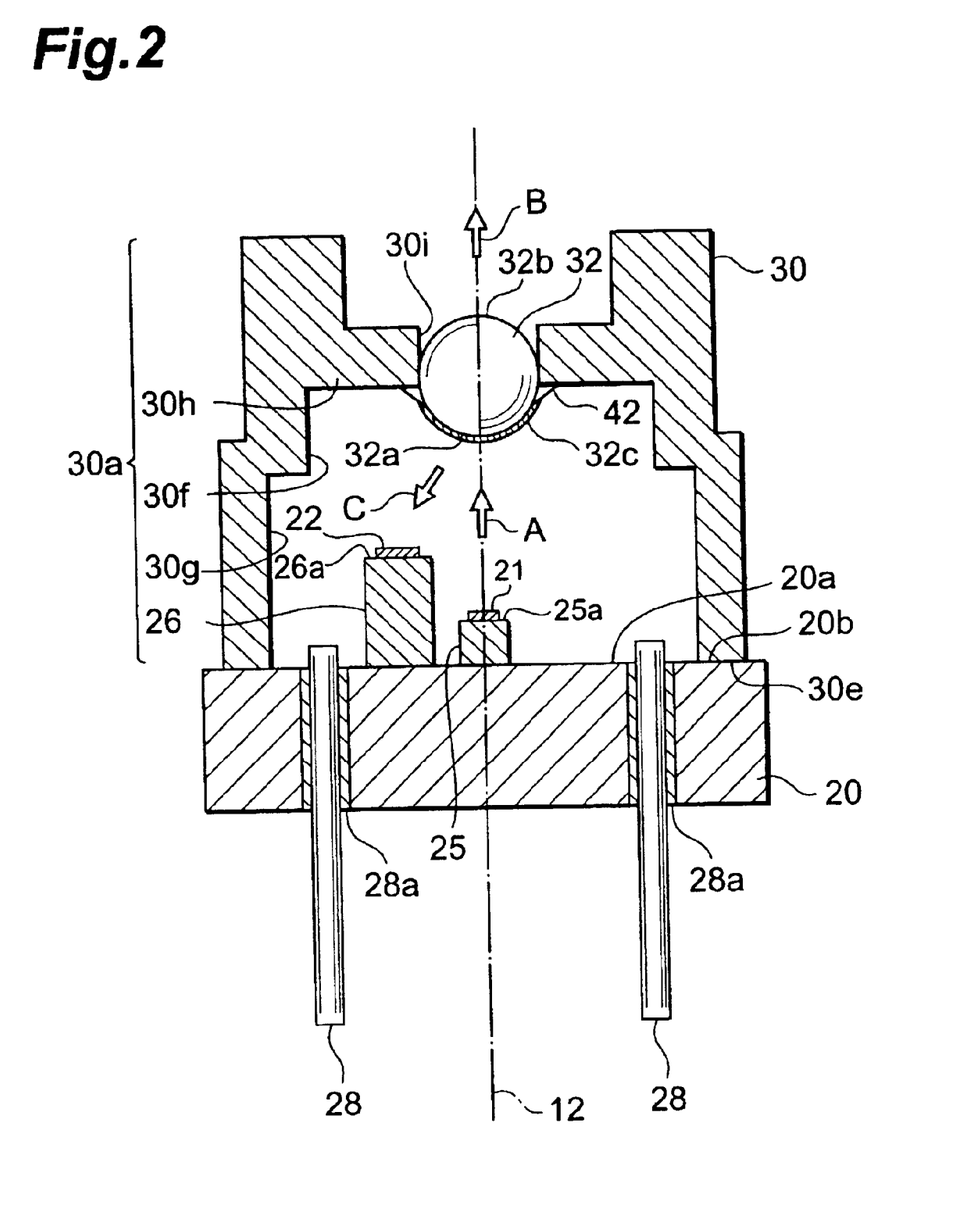
FIG. 2 is an enlarged sectional view of part of the light emitting module according to the first embodiment.

First, light emitting module 10 according to the first embodiment of the present invention will be described with reference to the accompanying drawings. FIG. 1 is a sectional view of light emitting module 10. FIG. 2 is an enlarged sectional view of mount member 20, semiconductor light emitting device 21, semiconductor light receiving device 22, lens holding member 30, and lens 32 in the light emitting module 10. As shown in FIGS. 1 and 2, the light emitting module 10 is provided with mount member 20, semiconductor light emitting device 21, semiconductor light receiving device 22, lens holding member 30, lens 32, sleeve 34, sleeve holder 36, ferrule 38, and optical waveguide member 39. Among these components, the mount member 20, lens holding member 30, sleeve 34, and sleeve holder 36 function as a housing that houses the optical components including the semiconductor light emitting device 21, semiconductor light receiving device 22, lens 32, and optical waveguide member 39.

In the light emitting module 10, the mount member 20, semiconductor light emitting device 21, lens holding member 30, lens 32, sleeve 34, sleeve holder 36, ferrule 38, and optical waveguide member 39 are arranged along predetermined axis 12. The description hereinafter concerns an example in which an optical fiber is applied as optical waveguide member 39. The optical fiber is an optical waveguide having a core part and a cladding part disposed around it. A primary coated optical fiber means a filament in a state in which the periphery thereof is coated with resin, and is set in ferrule 38 in FIG. 1.

The mount member 20 is a member extending along a plane intersecting with the predetermined axis 12 and is, for example, a metallic member made by plating a steel plate of predetermined shape with gold. The mount member 20 has a component mounting surface 20a extending along the above plane. First component mounting member 25 and second component mounting member 26 like chip carriers are placed on the component mounting surface 20a. The first component mounting member 25 has a support surface 25a for mounting of the semiconductor light emitting device 21. The semiconductor light emitting device 21 is placed on this support surface 25a so that the optical axis of the semiconductor light emitting device 21 is aligned with the predetermined axis 12. The second component mounting member 26 has a support surface 26a for mounting of the semiconductor light receiving device 22, and the semiconductor light receiving device 22 is mounted on this support surface 26a.

The lens holding member 30 is made of metal such as stainless steel and has tubular portion 30a extending along the predetermined axis 12. The tubular portion 30a has first inner wall surface 30g and second inner wall surface 30f, and ring flange 30h extends out from the second inner wall surface 30f so as to surround the predetermined axis 12. The inner peripheral surface of the flange 30h serves as a holding surface 30i to hold the lens 32. The holding surface 30i and lens 32 are joined to each other with adhesive material 42 like low-melting glass. This results in fixing the lens 32 to the lens holding member 30. One end face 30e of the tubular portion 30a of the lens holding member is placed on support surface 20b. The support surface 20b is provided around the component mounting surface 20a. One end face 30e and support surface 20b are joined to each other by fusion bonding.

The lens holding member 30 is fixed onto the mount member 20 in this way to form an interior space housing the semiconductor light emitting device 21 and semiconductor light receiving device 22. Then this interior space is kept airtight by the fusion bonding between one end face 30e and support surface 20b and by adhesive material 42.

Figure 3A:
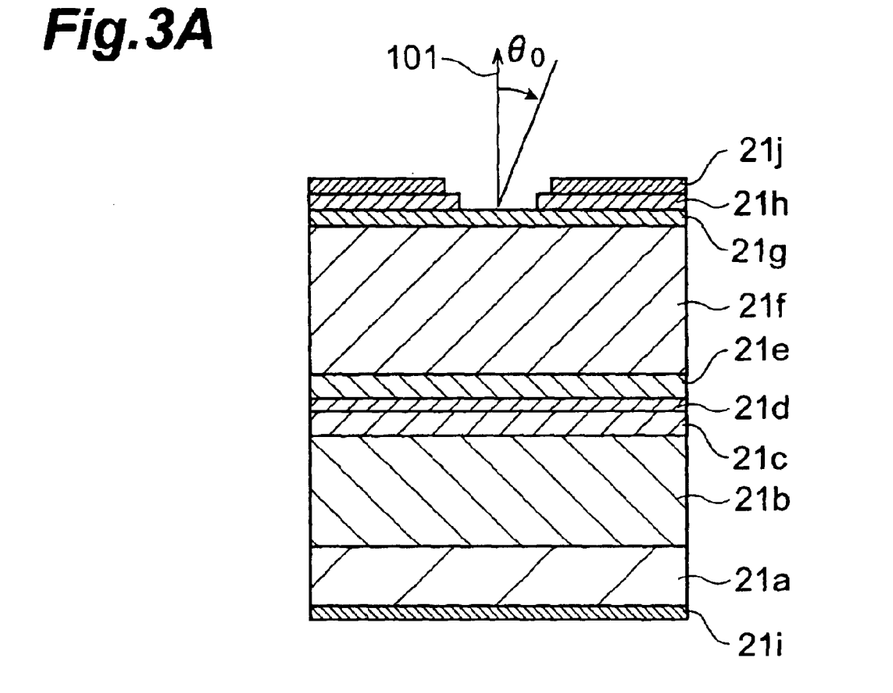
FIG. 3A is a sectional view of the semiconductor light emitting device according to an embodiment.

The semiconductor light emitting device 21 is, for example, a surface emitting type laser diode and is placed on the predetermined axis 12. The optical axis of semiconductor light emitting device 21 is directed in the direction of the predetermined axis 12. FIG. 3A is a sectional view showing an example of the structure of semiconductor light emitting device 21. As shown in FIG. 3A, the semiconductor light emitting device 21 of the surface emitting type has the following stack on n-type semiconductor substrate 21a: n-type semiconductor multilayer film mirror 21b, n-type cladding layer 21c, active layer 21d, p-type cladding layer 21e, p-type semiconductor multilayer film mirror 21f, p-type semiconductor layer 21g, p-type contact layer 21h, and metal layer 21j. Metal layer 21i is placed on the back surface of n-type semiconductor substrate 21a. The n-type semiconductor multilayer film mirror 21b and p-type semiconductor multilayer film mirror 21f constitute a resonator, and the active layer is located inside the resonator. Light resonating between n-type semiconductor multilayer film mirror 21b and p-type semiconductor multilayer film mirror 21f is emitted through an aperture provided in p-type contact layer 21h and metal layer 21j.

Figure 3B:
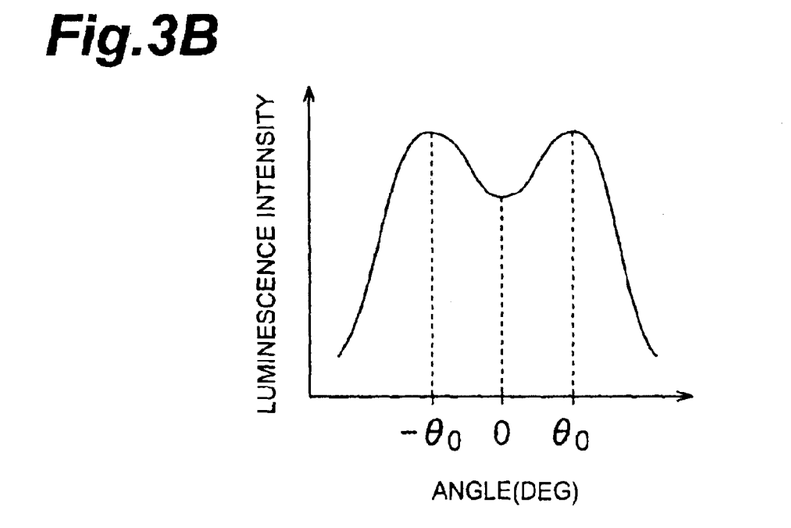
FIG. 3B is a diagram showing a luminescence intensity profile of the semiconductor light emitting device.

FIG. 3B shows a luminescence intensity profile of semiconductor light emitting device 21. In FIG. 3B, the horizontal axis represents the angle of inclination from the optical axis 101 (reference symbol 101 in FIG. 3A) of the semiconductor light emitting device 21, and the vertical axis the luminescence intensity. As shown in FIG. 3B, peaks of luminescence intensity of this semiconductor light emitting device 21 appear at angle $\theta_0$ relative to the optical axis 101, e.g., at the angle of 5(DEG). As described later, the light monitored by the semiconductor light receiving device 22 is reflected light made in such a way that the light outgoing at the angle of inclination from the optical axis out of the light from the semiconductor light emitting device 21 is reflected by the front surface of lens 32. Therefore, when the semiconductor light emitting device 21 has the peaks of luminescence intensity at the angle of inclination from the optical axis, the intensity is increased of the light monitored by the semiconductor light receiving device 22. Part of the light from the semiconductor light emitting device 21 is reflected by the front surface of lens 32 to become return beams to the semiconductor light emitting device 21. When the semiconductor light emitting device 21 has the peaks of luminescence intensity at the angle of inclination from the optical axis, the intensity of the return beams is decreased, so as to be able to suppress noise made in the semiconductor light emitting device 21.

Figure 4:
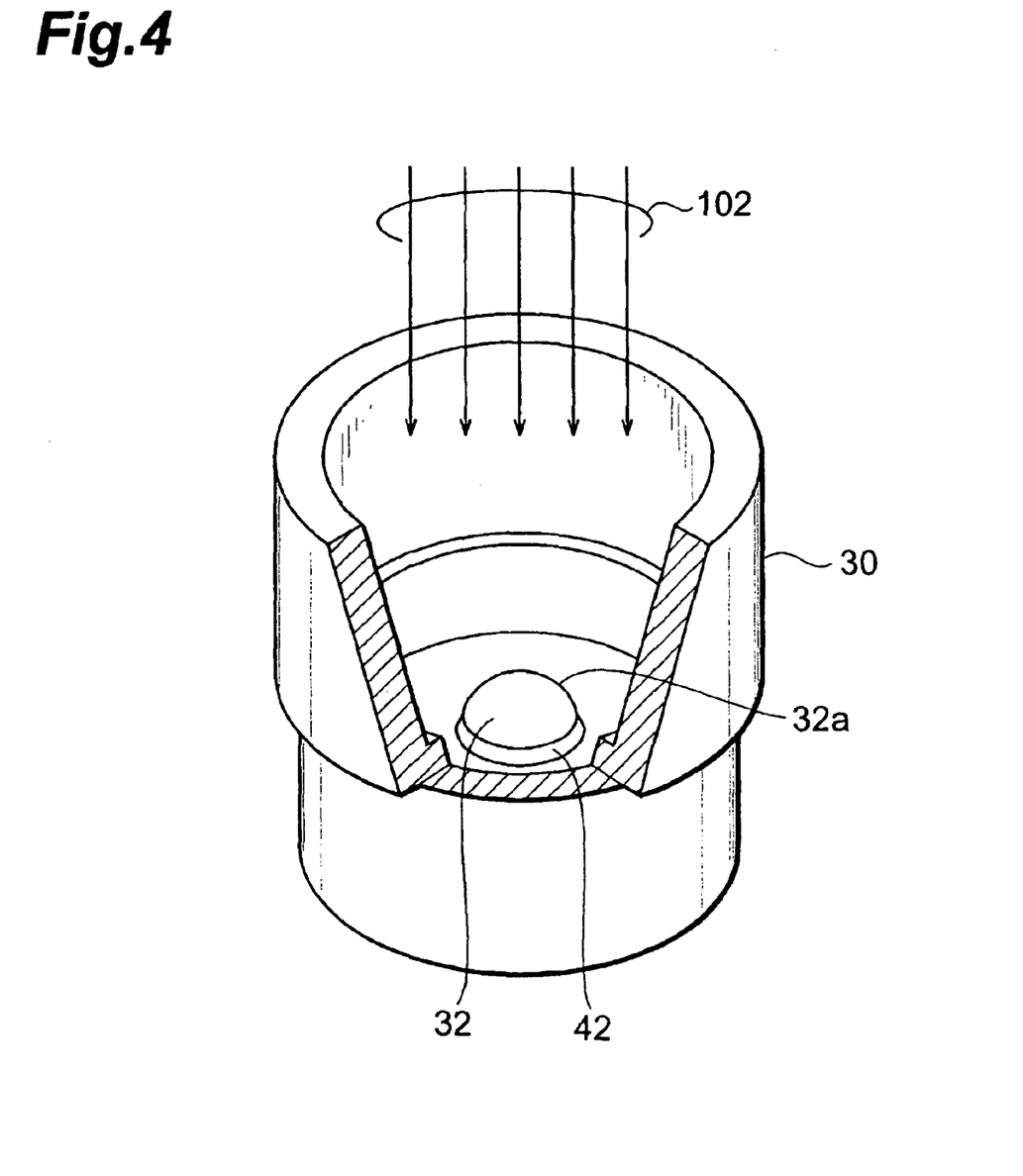
FIG. 4 is a perspective view for explaining a method of forming a reflecting film on a surface of a lens.

Referring back to FIGS. 1 and 2, the lens 32 is a ball lens in the present embodiment. The lens 32 is held by holding surface 30i of lens holding member 30. The lens 32 has a first surface 32a facing the semiconductor light emitting device 21 and a second surface 32b located on the back side opposite to the first surface 32a. Reflecting film 32c is formed on the first surface 32a. The reflecting film 32c has the reflectance of 20%. The reflecting film 32c consists of a plurality of oxide films. FIG. 4 is a drawing for explaining a method of forming this reflecting film 32c. As shown in FIG. 4, the lens 32 is first fixed to the lens holding member 30 and thereafter the lens holding member 30 is set in a film forming apparatus. The film forming apparatus is then activated to evaporate oxide on the first surface 32a (reference symbol 102 in FIG. 4). As a consequence, the reflecting film 32c is deposited on the first surface 32a of lens 32. Since this light emitting module 10 is provided with the reflecting film on the first surface 32a of lens 32, the reflecting film can be deposited on only one side, and this is more economical than in the case where the reflecting film is deposited on the both sides.

Referring back to FIGS. 1 and 2, the semiconductor light receiving device 22 is a light receiving element such as a photodiode. This semiconductor light receiving device 22 is mounted on the second component mounting member 26 and disposed next to the semiconductor light emitting device 21. The semiconductor light receiving device 22 monitors the light from semiconductor light emitting device 21. This monitor light is light reflected by the reflecting film 32c formed on the first surface 32a of lens 32, among the light from the semiconductor light emitting device 21. By placing both the semiconductor light receiving device 22 and semiconductor light emitting device 21 on the component mounting surface 20a, the light receiving surface of the semiconductor light receiving device 22 and the light emitting surface of the semiconductor light emitting device 21 are aimed in the direction of predetermined axis 12. This arrangement permits the semiconductor light receiving device to receive the reflected light from lens 32, without need for separating the forward light emitted from the semiconductor light emitting device 21, by a half mirror.

The semiconductor light receiving device 22 is mounted on the second component mounting member 26, and the semiconductor light emitting device 21 is mounted on the first component mounting member 25; and they are placed on the component mounting surface 20a. With use of these first component mounting member 25 and second component mounting member 26, the semiconductor light receiving device 22 can be located nearer to the lens 32 than the semiconductor light emitting device 21. By locating the semiconductor light receiving device 22 nearer to the lens 32, the intensity can be increased of the light entering the semiconductor light receiving device 22.

The mount member 20 has a plurality of insert holes extending in the direction of predetermined axis 12, and lead terminals 28 are inserted in these insert holes. The spaces between inner walls of the insert holes and the lead terminals 28 are filled with glass material 28a. The glass material 28a fixes the lead terminals 28 while maintaining insulation between the mount member 20 and the lead terminals 28. The present embodiment describes an example provided with four lead terminals 28. Then each lead terminal 28 is electrically connected to either of the semiconductor light emitting device 21 and semiconductor light receiving device 22 by a bonding wire.

Figure 5:
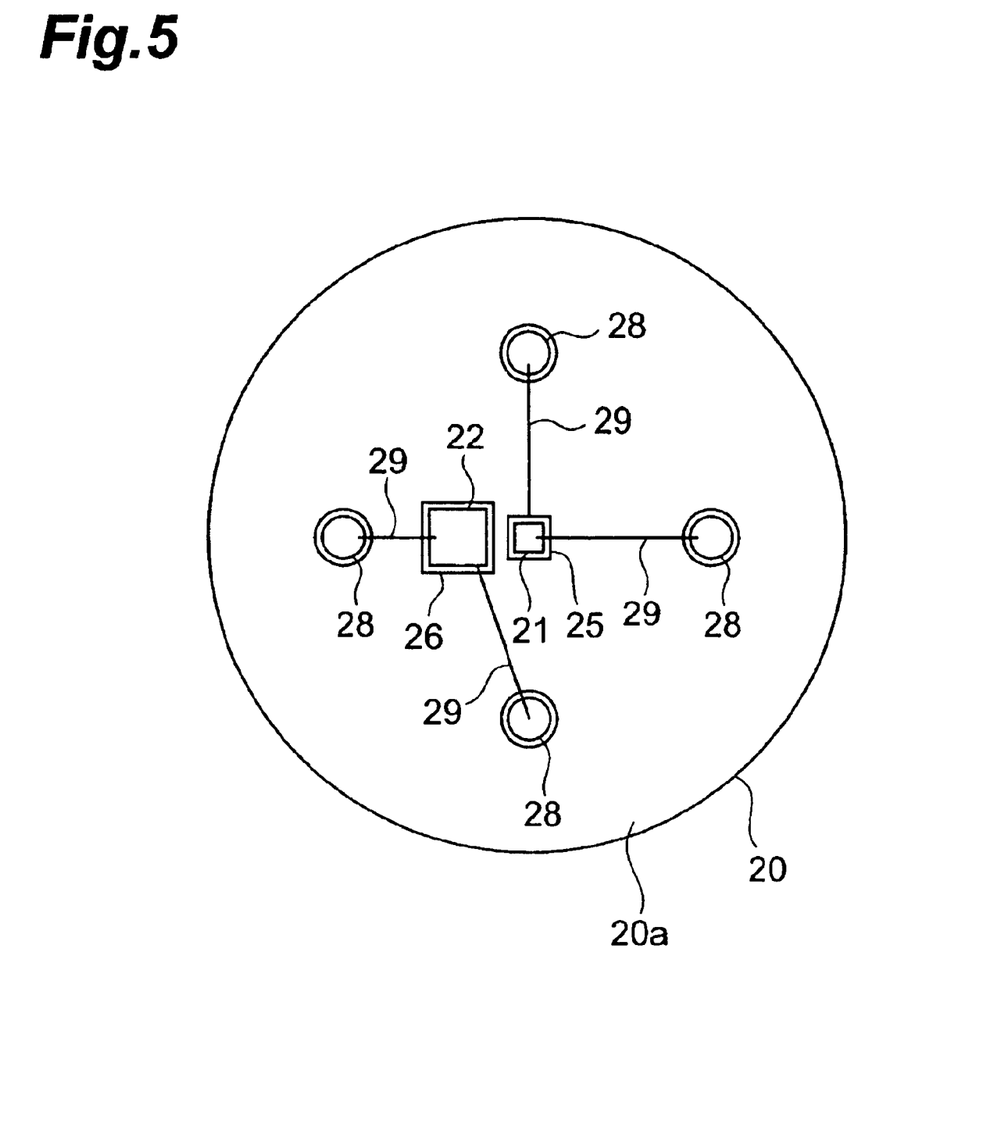
FIG. 5 is a plan view of the mount member in the light emitting module according to the first embodiment.

FIG. 5 is a plan view of mount member 20. As shown in FIG. 5, the semiconductor light emitting device 21 is mounted on the first component mounting member 25 on the component mounting surface 20a of mount member 20. The semiconductor light receiving device 22 is located next to the semiconductor light emitting device 21 while being mounted on the second component mounting member 26. Then each of the semiconductor light emitting device 21 and semiconductor light receiving device 22 is electrically connected through bonding wires 29 to the lead terminals 28 appearing on the component mounting surface 20a side.

Referring back to FIG. 1, the sleeve holder 36 is made of metal such as stainless steel and is a tubular member extending along the predetermined axis 12. The sleeve holder 36 has an inside surface 36a for holding sleeve 34. An aperture through which sleeve 34 is inserted is made at one end of sleeve holder 36. The other end is placed on end face 30j of lens holding member 30.

The sleeve 34 is a member made of metal such as stainless steel and has a tubular portion 34a extending along the predetermined axis 12. An aperture through which ferrule 38 is inserted is formed at one end 34c of the tubular portion 34a. For this purpose, taper surface 34d is formed at one end 34c. At other end 34b there is provided an aperture through which the light from semiconductor light emitting device 21 passes. The sleeve 34 has inner wall surface 34e extending along the axis 12. The inner wall surface 34e defines a space for housing the ferrule 38 and a direction for guiding the ferrule 38.

The sleeve 34 is placed on the second end face 30j of lens holding member 30. The sleeve 34 is positioned relative to the lens holding member 30 so that the optical fiber 39 can receive light from the semiconductor light emitting device 21 with certainty. The sleeve 34 is fixed at one end of sleeve holder 36. The fixing is implemented, for example, by simultaneously forming fixing portions at a plurality of locations by laser beam welding with a YAG laser beam. Strain possibly caused by the fixing can be reduced by locating the fixing portions with high symmetry. This can reduce degradation of optical coupling between optical fiber 39 and semiconductor light emitting device 21.

The ferrule 38 is housed in sleeve 34. The fixing of ferrule 38 to sleeve 34 is implemented, for example, by welding. Since the location of ferrule 38 is fixed relative to the sleeve 34, optical coupling is stabilized between lens 32 and one end 39a of optical waveguide member 39 like an optical fiber. The location of ferrule 38 is determined according to the focal length of lens 32.

The ferrule 38 has first end face 38a, second end face 38b, and hole 38c extending along the axis 12 from the first end face 38a to the second end face 38b. A resin-stripped optical fiber is inserted in the hole 38c. The first end face 38a and second end face 38b are polished after the optical fiber is inserted into the hole 38c. By this polishing, the ends of optical fiber 39 surely appear in the respective end faces 38a, 38b.

The second end face 38b is polished so as to make a first angle relative to the axis 12, for example, approximately a right angle. This polishing strengthens the optical coupling between the end of the optical fiber and another optical fiber 46. The first end face 38a is inclined at a second angle α greater than the angle of 90°, for example, at about 6° relative to the axis 12. By employing this inclined end face 38a, it becomes feasible to prevent reflected light from this end face 38a from returning to the light emitting module 10.

The tubular portion 34a of sleeve 34 has first and second portions 34f, 34g adjacent to each other along the axis 12. The first portion 34f houses the ferrule 38. The second portion 34g is formed so as to permit insertion of ferrule 44. The ferrule 44 holds another optical fiber 46 to be optically coupled to the optical fiber 39.

Next, the operation of light emitting module 10 will be described. As shown in FIG. 2, the semiconductor light emitting device 21 emits light A toward lens 32. Then the light A arrives at the reflecting film 32c provided on the first surface 32a of lens 32, and part thereof is transmitted to propagate inside the lens 32. The light having propagated inside the lens 32 is outputted as light B from the second surface 32b of lens 32 to be condensed at the end of optical waveguide member 39. This light B is incident into the optical waveguide member 39 and optical fiber 46. On the other hand, part of the light A is reflected by the reflecting film 32c provided on the first surface 32a of lens 32 to become light C, and the light C is incident into the semiconductor light receiving device 22. The semiconductor light receiving device 22 outputs a photocurrent according to quantity of light C to the lead terminal 28. The output of light emitted from the semiconductor light emitting device 21 is controlled based on this photocurrent.

Figure 6:
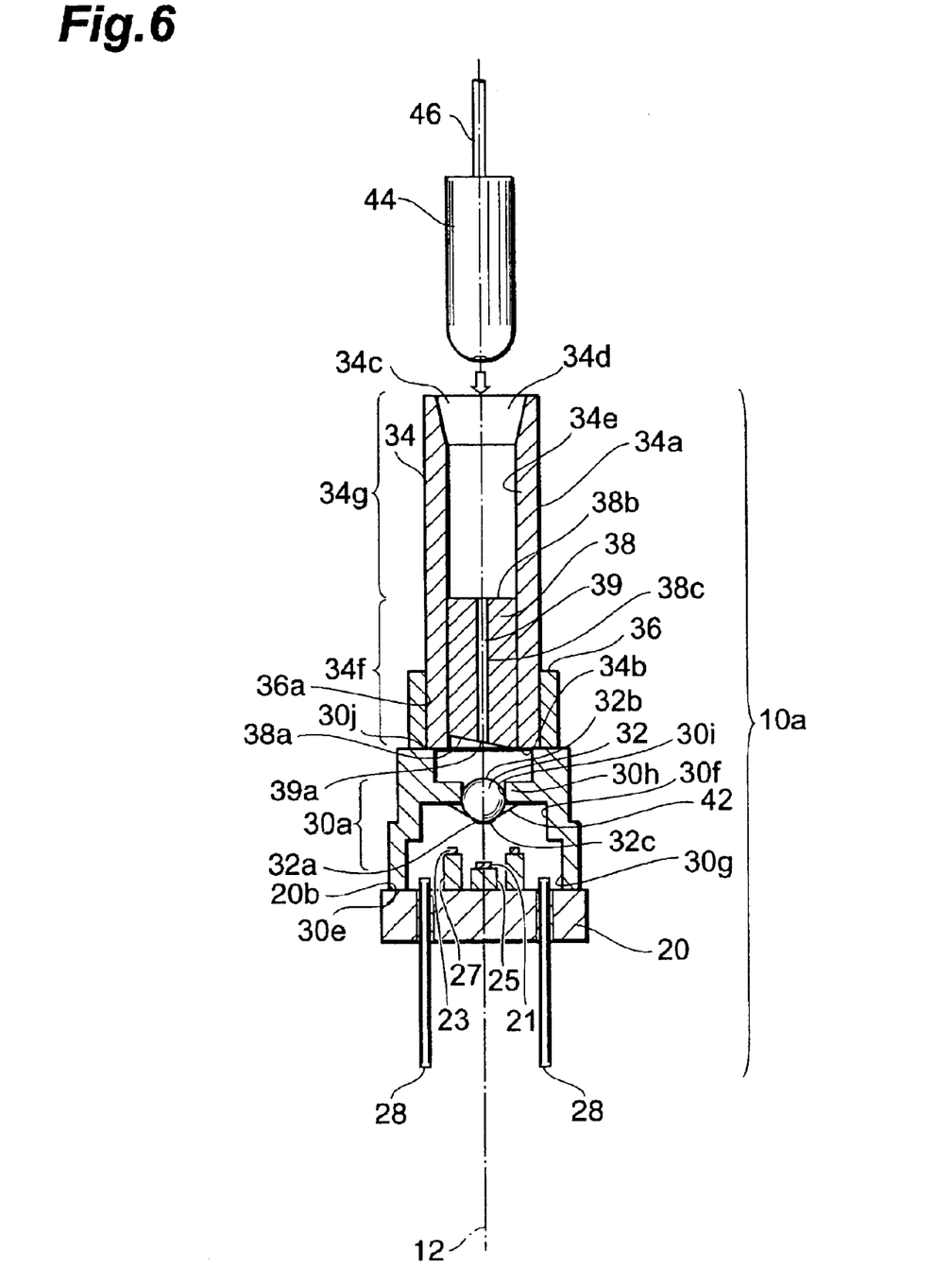
FIG. 6 is a sectional view of the light emitting module according to the second embodiment.

Next, light emitting module 10a according to the second embodiment will be described. FIG. 6 is a sectional view of light emitting module 10a according to the second embodiment. As shown in FIG. 6, the light emitting module 10a is provided with mount member 20, semiconductor light emitting device 21, semiconductor light receiving device 23, lens holding member 30, lens 32, sleeve 34, sleeve holder 36, ferrule 38, and optical waveguide member 39 as the light emitting module 10 in the first embodiment was. The mount member 20, semiconductor light emitting device 21, lens holding member 30, lens 32, sleeve 34, sleeve holder 36, ferrule 38, and optical waveguide member 39 are arranged along predetermined axis 12. The other components similar to those in the first embodiment will not be described herein. The semiconductor light receiving device 23 will be described below.

Figure 7:
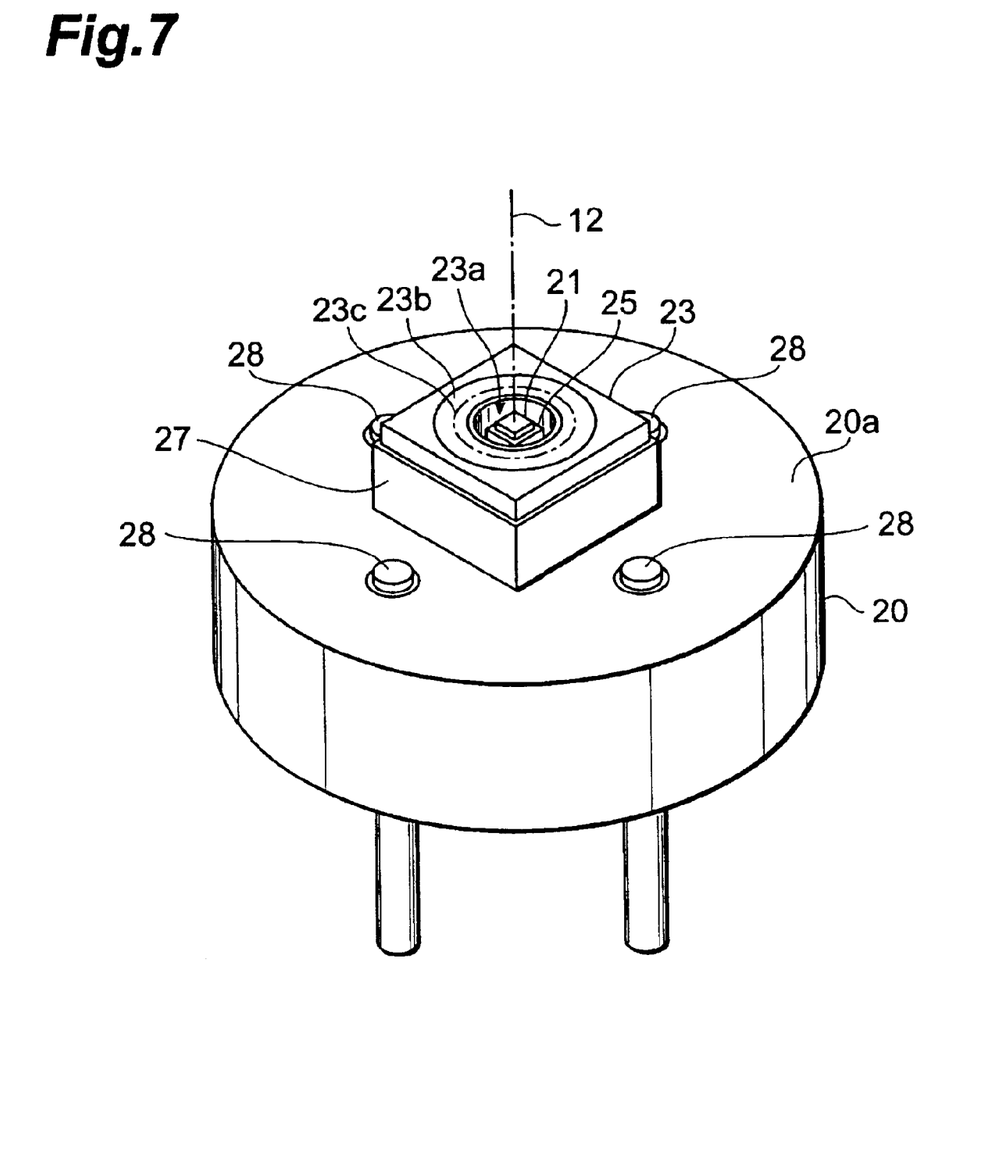
FIG. 7 is a perspective view of the mount member in the light emitting module according to the second embodiment.
Figure 8:
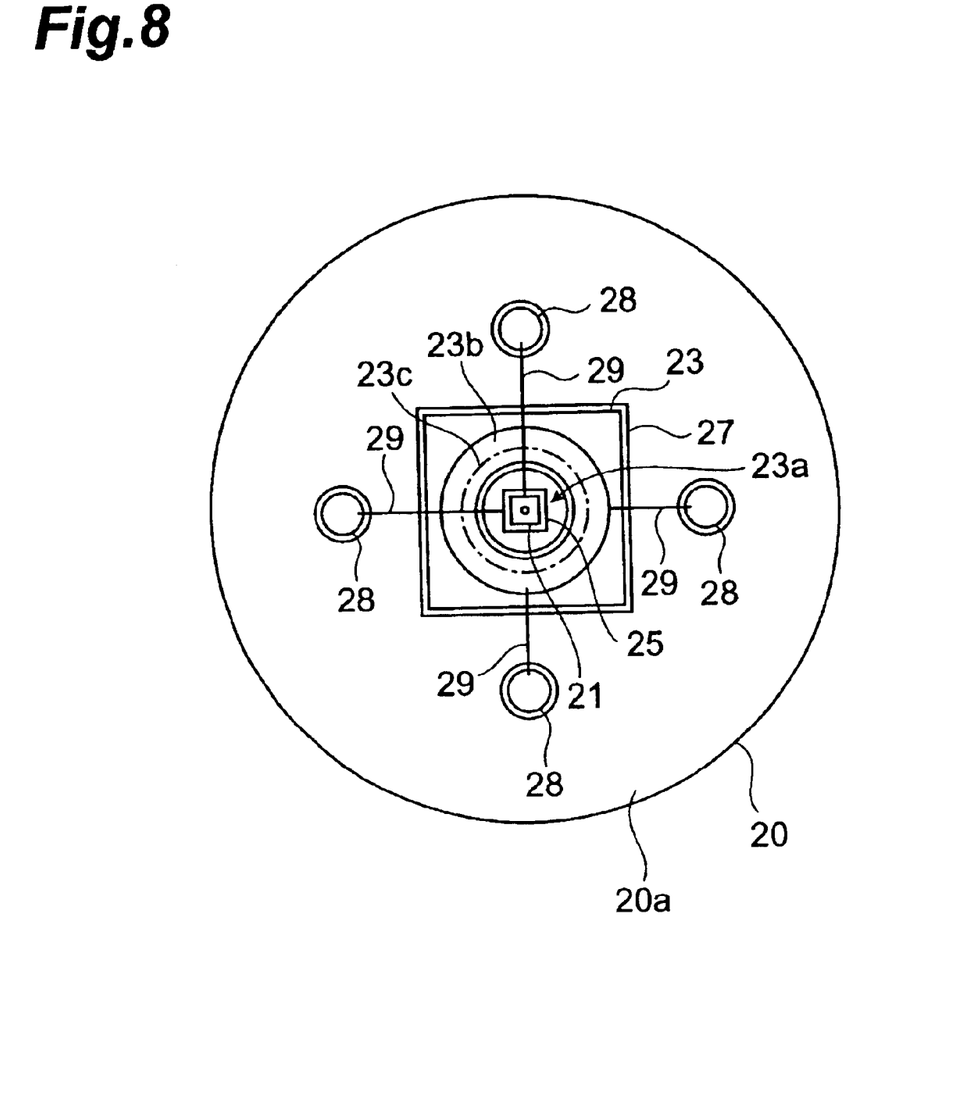
FIG. 8 is a plan view of the mount member in the light emitting module according to the second embodiment.

FIG. 7 is a perspective view of semiconductor light emitting device 21 and semiconductor light receiving device 23 placed on the component mounting surface 20a of mount member 20. FIG. 8 is a plan view of the semiconductor light emitting device 21 and semiconductor light receiving device 23 placed on the component mounting surface 20a of mount member 20. With reference to FIGS. 7 and 8, the semiconductor light receiving device 23 has a hole 23a extending along the predetermined axis 12, and a light receiving portion 23b is formed along closed curve 23c surrounding the predetermined axis 12. The second component mounting member 27 carrying the semiconductor light receiving device 23 has a hole continuous to the hole 23a. Inside this hole 23a, the semiconductor light emitting device 21 is housed with its optical axis being directed in the direction of the predetermined axis 12. The semiconductor light emitting device 21 is mounted on the first component mounting member 25. The semiconductor light receiving device 23 is located nearer to the lens 32 than the semiconductor light emitting device 21, as in the first embodiment.

The semiconductor light receiving device 23 is provided with light receiving portion 23b provided along the predetermined closed curve on the semiconductor substrate, and hole 23a provided inside the light receiving portion 23b. The hole 23a is made, for example, by machining or by etching.

Figure 9:
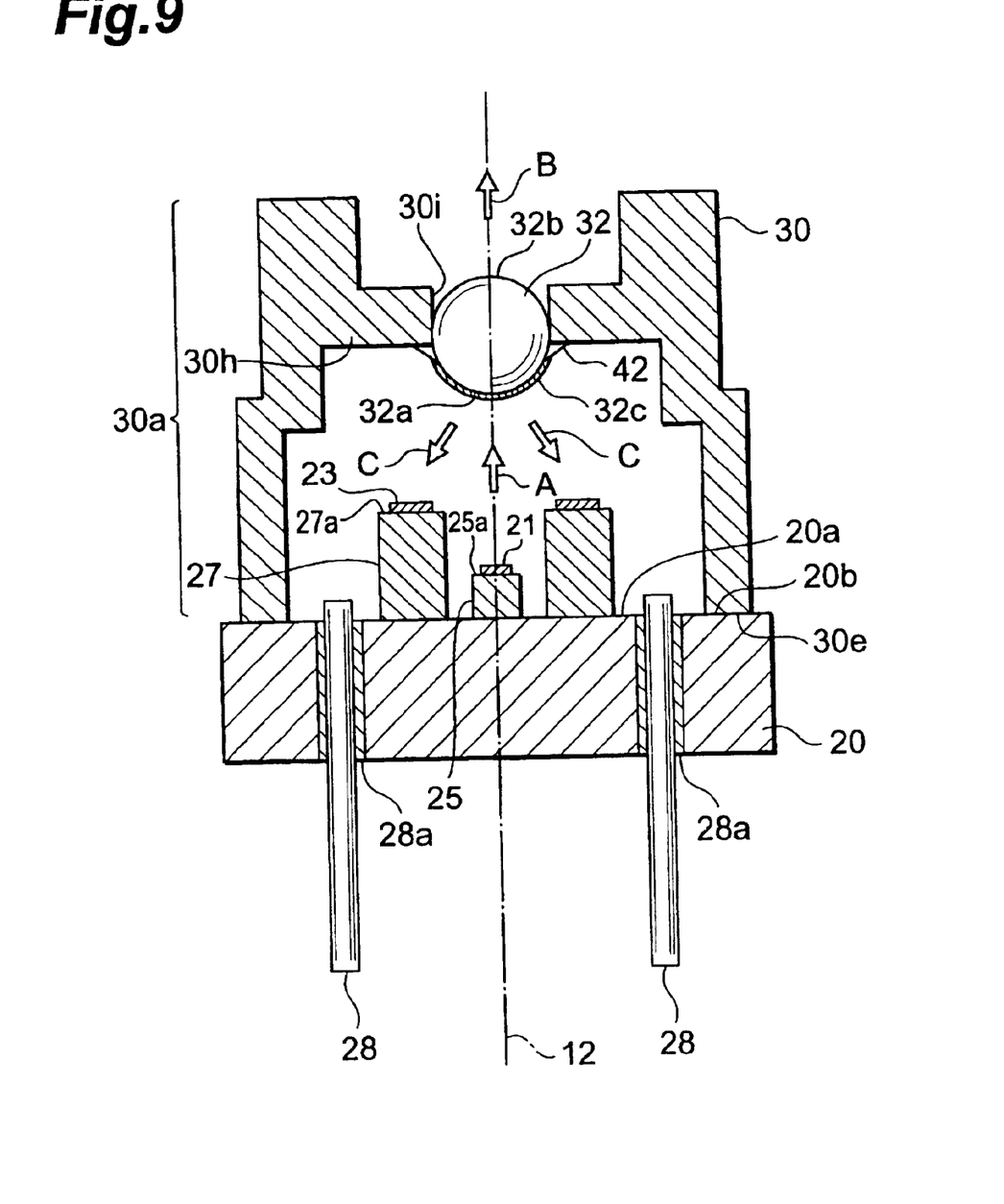
FIG. 9 is an enlarged sectional view of part of the light emitting module according to the second embodiment.

Next, the operation of light emitting module 10a according to the second embodiment carrying the semiconductor light receiving device 23 as described above will be described. FIG. 9 is an enlarged sectional view of mount member 20, semiconductor light emitting device 21, semiconductor light receiving device 23, lens holding member 30, and lens 32 in the light emitting module 10 according to the second embodiment. As shown in FIG. 9, part of light A emitted by the semiconductor light emitting device 21 travels through the reflecting film 32c provided on the first surface 32a of lens 32 to emerge from the second surface of lens 32. On the other hand, part of the light A emitted by the semiconductor light emitting device 21 is reflected by the reflecting film 32c to become light C, and the light C is incident into the semiconductor light receiving device 23. Since the semiconductor light receiving device 23 has the light receiving portion 23b around the semiconductor light emitting device 21, it can receive more reflected light (light C) than the semiconductor light receiving device 22 in the first embodiment. The semiconductor light receiving device 23 generates a photocurrent according to quantity of light C and this photocurrent is outputted to the lead terminal 28. The output of light emitted from the semiconductor light emitting device 21 is controlled based on this photocurrent.

Figure 10:
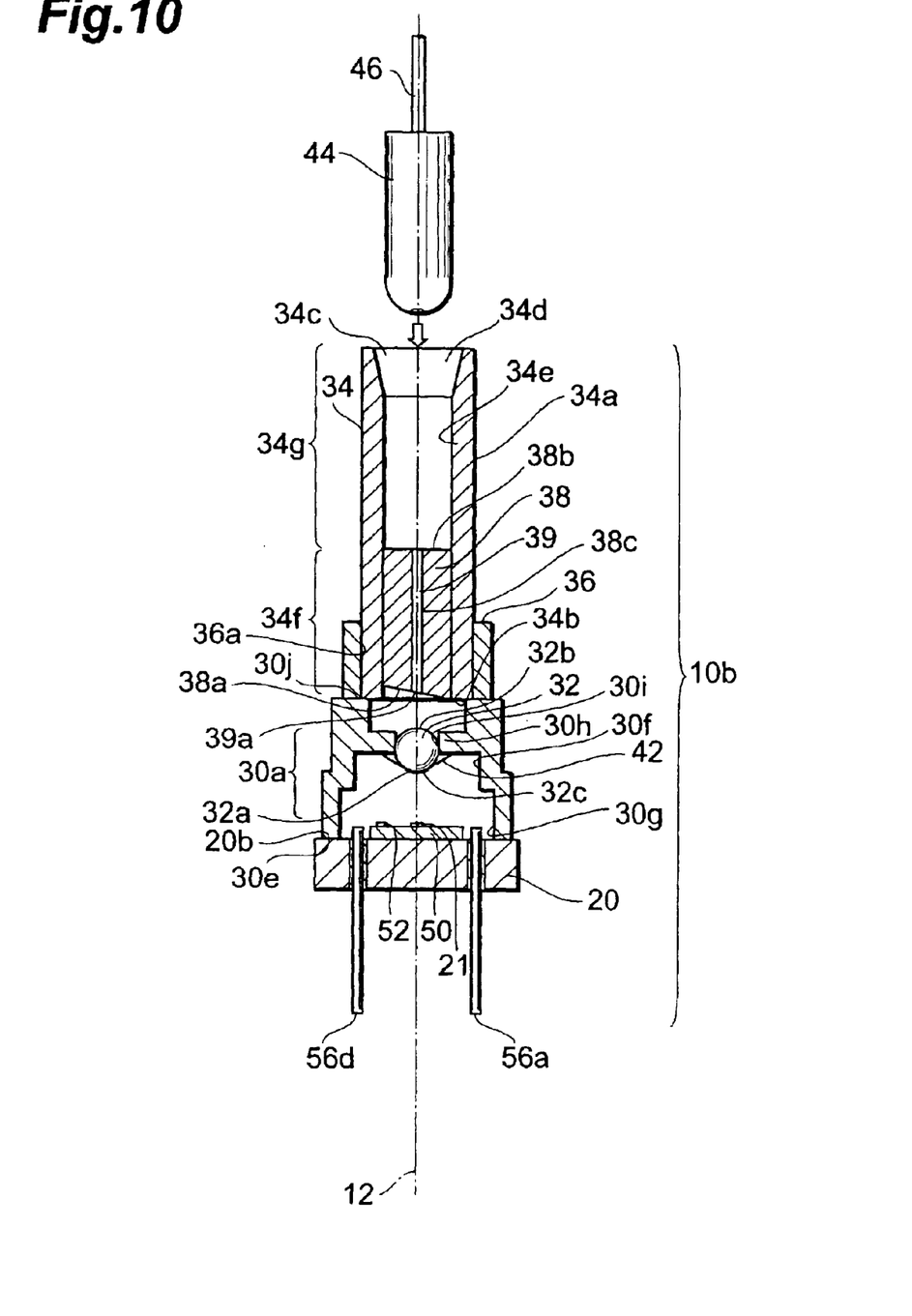
FIG. 10 is a sectional view of the light emitting module according to the third embodiment.

Next, light emitting module 10b according to the third embodiment will be described. As shown in FIG. 10, the light emitting module 10b is provided with mount member 20, semiconductor light emitting device 21, lens holding member 30, lens 32, sleeve 34, sleeve holder 36, ferrule 38, and optical waveguide member 39 as the light emitting module 10 in the first embodiment was. The mount member 20, semiconductor light emitting device 21, lens holding member 30, lens 32, sleeve 34, sleeve holder 36, ferrule 38, and optical waveguide member 39 are arranged along predetermined axis 12. Furthermore, the light emitting module 10b is provided with heatsink 50 and a plurality of semiconductor light receiving device 52.

Figure 11:
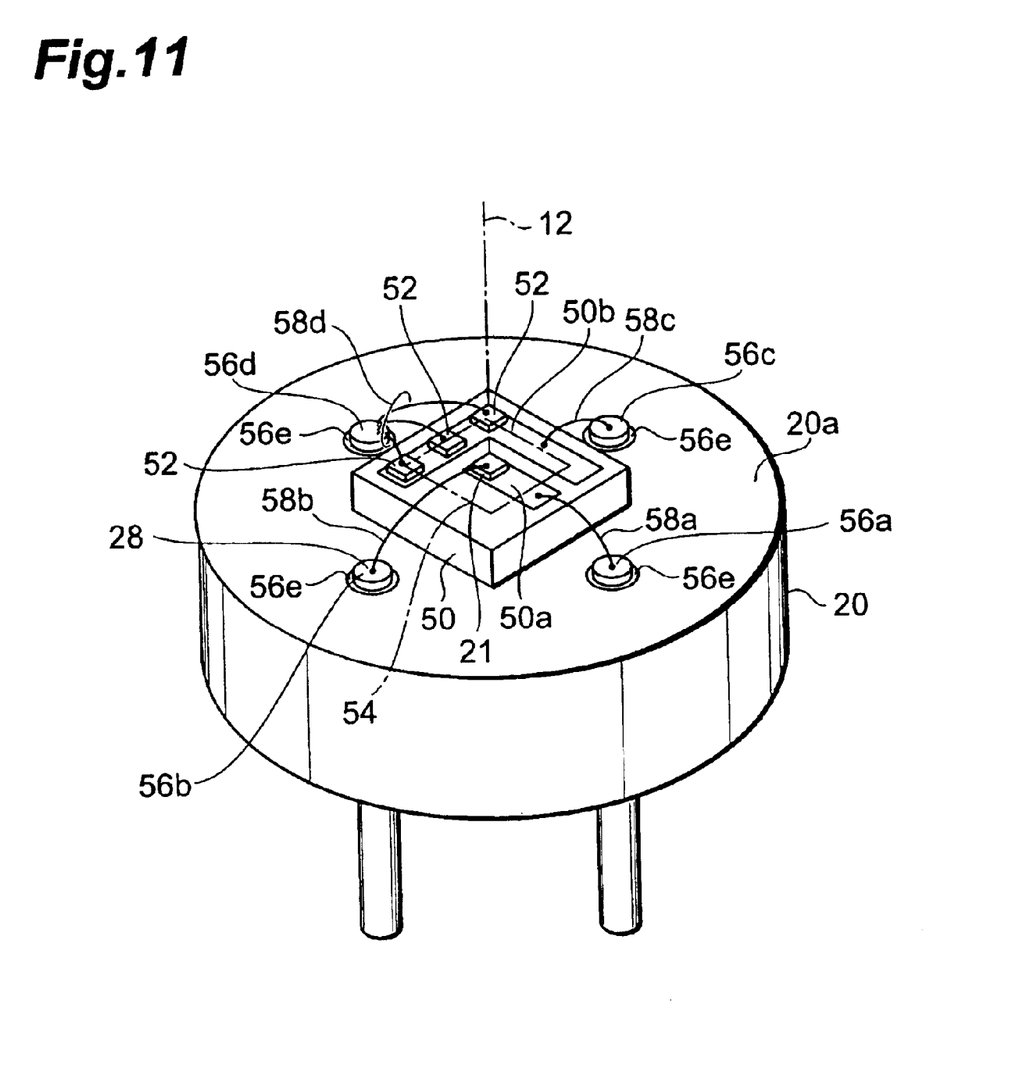
FIG. 11 is a perspective view of the mount member in the light emitting module according to the third embodiment.

With reference to FIG. 11, the heatsink 50 is mounted on the component mounting surface 20a of mount member 20. The heaksink 50 has first wiring pattern 50a and second wiring pattern 50b. The second wiring pattern 50b is formed along closed curve 54 surrounding the predetermined axis 12.

The semiconductor light emitting device 21 is mounted on the first wiring pattern 50a. One electrode of the semiconductor light emitting device 21 is electrically connected to the first wiring pattern 50a.

The semiconductor light receiving devices 52 is mounted on the second wiring pattern 50b. One electrode of each semiconductor light receiving device 52 is electrically connected to the second wiring pattern 50b.

The mount member 20 has a plurality of insert holes extending in the direction of predetermined axis 12, and lead terminals are inserted in these insert holes. In this embodiment lead terminal 56a, 56b, 56c, and 56d are provided as the lead terminals. The spaces between inner walls of the insert holes and the lead terminals are filled with glass material 56e. The lead terminal 56a is electrically connected to the first wiring pattern 50a by bonding wire 58a, and the lead terminal 56b is electrically connected to the other electrode of the semiconductor light emitting device 21 by bonding wire 58b. The lead terminal 56c is electrically connected to the second wiring pattern 50b by bonding wire 58c, and the lead terminal 56d is electrically connected to the other electrode of each semiconductor light receiving devices 52 by bonding wire 58d.

Figure 12:
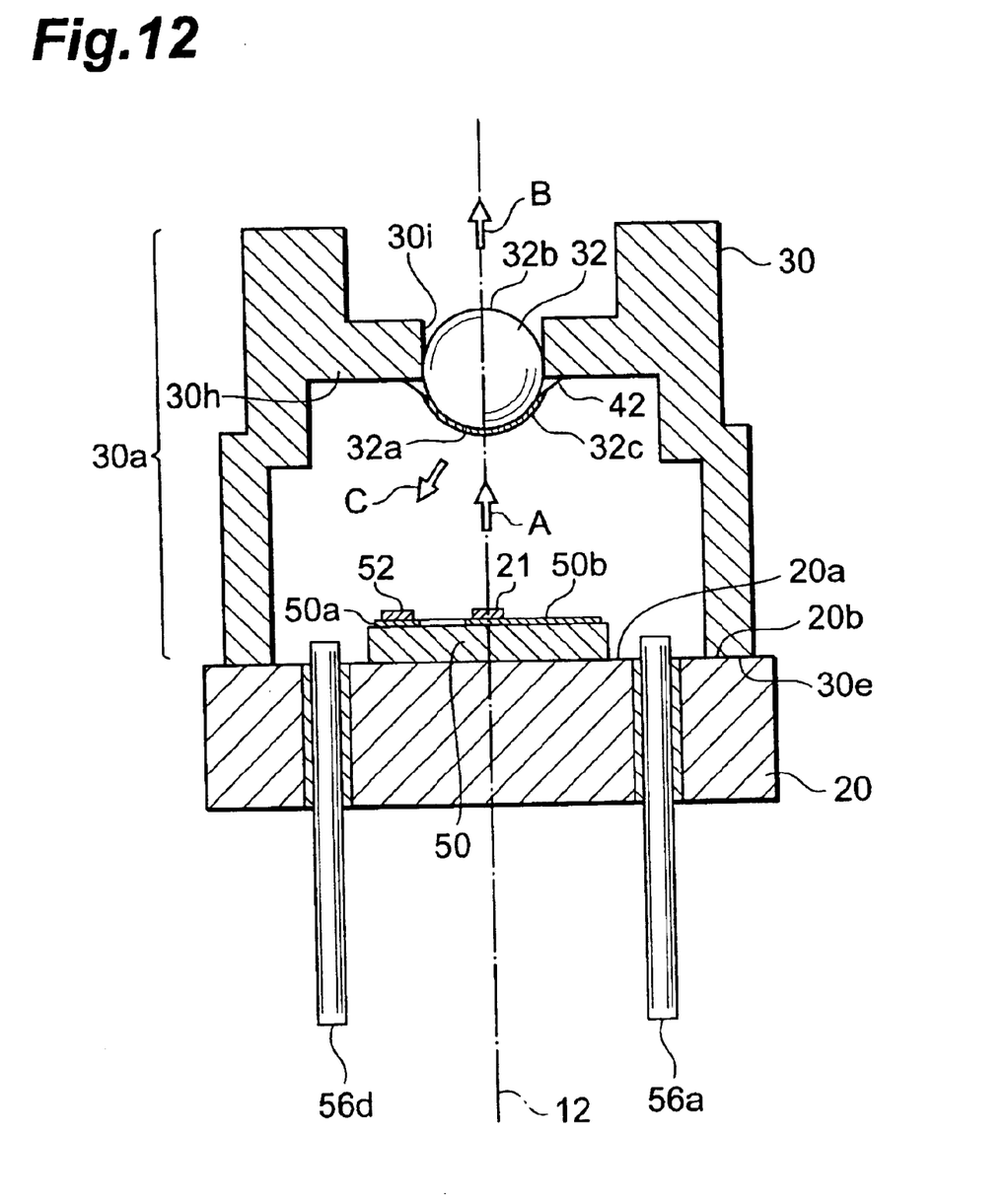
FIG. 12 is an enlarged sectional view of part of the light emitting module according to the third embodiment.

Next, the operation of light emitting module 10b will be described. As shown in FIG. 12, part of light A emitted by the semiconductor light emitting device 21 travels through the reflecting film 32c provided on the first surface 32a of lens 32 to emerge from the second surface of lens 32. On the other hand, part of the light A emitted by the semiconductor light emitting device 21 is reflected by the reflecting film 32c to become light C, and the light C is incident into the semiconductor light receiving devices 52. Since the semiconductor light receiving devices 52 are placed around the semiconductor light emitting device 21, they can receive more reflected light (light C) than the semiconductor light receiving device 22 in the first embodiment.

As described above with the first, second, and third embodiments, the light emitting module 10 is constructed in the configuration wherein the reflecting film provided on the first surface of the lens reflects part of the light emitted by the semiconductor light emitting device to make it incident into the semiconductor light receiving device. Accordingly, it is feasible to monitor the light by the semiconductor light receiving device, without need for separating the forward light from the semiconductor light emitting device by a half mirror.

It is noted that the present invention can be modified in a variety of ways, without having to be limited to the above embodiments. For example, the light emitting modules described in the above embodiments were the examples in which the surface emitting type semiconductor light emitting device was applied, but the light emitting module of this configuration can also be used in the case of modules using an edge emitting type semiconductor light emitting device and monitoring the forward light thereof by the semiconductor light receiving device.

In the above embodiments the lens was a spherical lens, but the lens may also be an aspherical lens as long as it can condense the light emitted by the semiconductor light emitting device and has a surface contour capable of reflecting part of light toward the semiconductor light receiving device. The reflecting film may be provided over the entire surface of the lens.

The above embodiments described the configuration wherein the semiconductor light receiving device was located nearer to the lens than the semiconductor light emitting device, but the placement of the semiconductor light emitting device and the semiconductor light receiving device can embrace a variety of modification examples capable of securing the sufficient intensity of the light incident into the semiconductor light receiving device.

The reflecting film can have the reflectance not less than 5% and not more than 30% to secure the sufficient intensity of the light from the semiconductor light emitting device into the semiconductor light receiving device and into the optical fiber.

What is claimed is:

1. A light emitting module comprising:
a housing comprising a mount member and a lens holding member, the mount member having a support surface provided along a predetermined surface intersecting with a predetermined axis, a hole extending in a direction of the predetermined axis, a lead terminal passing through the hole, and a component mounting surface provided along the predetermined surface;
a semiconductor light emitting device having a light emitting surface intersecting with the predetermined axis and being mounted on the mount member;
a lens held by the lens holding member, the lens having a first surface which reflects part of light from the semiconductor light emitting device and transmits part of the light, and a second surface which outputs the light transmitted by the first surface; and
a semiconductor light receiving device having a light receiving surface for receiving the reflected light and being mounted on the mount member,
wherein the lens holding member is placed on the support surface of the mount member so as to cover the semiconductor light emitting device and the semiconductor light receiving device, and wherein a distance between the light receiving surface of the semiconductor light receiving device and the component mounting surface is larger than a distance between the light emitting surface of the semiconductor light emitting device and the component mounting surface.

2. The light emitting module according to claim 1, wherein said semiconductor light emitting device comprises a surface emitting type semiconductor laser.

3. The light emitting module according to claim 1, wherein the lens has a reflecting film capable of reflecting part of the light from the semiconductor light emitting device and transmitting part of the light, on the first surface.

4. The light emitting module according to claim 3, wherein the reflecting film demonstrates a reflectance of not less than 5%.

5. The light emitting module according to claim 4, wherein the reflecting film further demonstrates the reflectance of not more than 30%.

6. The light emitting module according to claim 1, wherein the lens is a ball lens.

7. The light emitting module according to claim 1, wherein the semiconductor light emitting device has a luminescence intensity profile having a peak intensity at a predetermined angle of inclination from the optical axis of the semiconductor light emitting device.

8. The light emitting module according to claim 1, wherein the semiconductor light receiving device comprises a semiconductor chip with a hole extending in the direction of the predetermined axis, and a light receiving portion provided in the semiconductor chip and along a closed curve surrounding the predetermined axis, and
wherein the semiconductor light emitting device is housed in the hole of the semiconductor light receiving device.

9. The light emitting module according to claim 1, further comprising an optical fiber optically coupled to the second surface of the lens and held by the housing.

10. A light emitting module comprising:
a housing comprising a mount member and a lens holding member;
a semiconductor light emitting device having a type of surface emitting semiconductor laser with a luminescence intensity profile with a peak intensity profile having an inclination from an optical axis of the semiconductor light emitting device, the semiconductor light emitting device being mounted on the mount member;
a lens held by the lens holding member, the lens having a first surface with a reflecting film thereon capable of reflecting part of light from the semiconductor light emitting device and transmitting part of the light, and a second surface for outputting the light transmitted by the first surface, the first surface and the second surface being convex surfaces;
a semiconductor light receiving device mounted on the mount member and arranged to receive the reflected light from the first surface; and
an optical fiber optically and directly coupled to the second surface of the lens and held by the housing,
wherein a light emitting surface of the semiconductor light emitting device is optically and directly coupled to the first surface of the lens.

11. The light emitting module according to claim 10, wherein the light emitting surface of the semiconductor light emitting device is provided along another surface intersecting with the predetermined axis.

12. The light emitting module according to claim 10, wherein the semiconductor light receiving device has a light receiving surface for receiving said reflected light, and wherein the light receiving surface is provided along another surface intersecting with the predetermined axis.

13. A light emitting module comprising:

a housing comprising a mount member and a lens holding member, the mount member having a support surface provided along a predetermined surface intersecting with a predetermined axis, a hole extending in a direction of the predetermined axis, a lead terminal passing through the hole, and a component mounting surface provided along the predetermined surface;

a semiconductor light emitting device having a light emitting surface intersecting with the predetermined axis and being mounted on the mount member;

a lens held by the lens holding member, the lens having a first surface which reflects part of light from the semiconductor light emitting device and transmits part of the light, and a second surface which outputs the light transmitted by the first surface; and a semiconductor light receiving device having a light receiving surface for receiving the reflected light and being mounted on the mount member, an optical fiber optically and directly coupled to the second surface of the lens and held by the housing;

wherein the lens holding member is placed on the support of the mount member so as to cover the semiconductor light emitting device and the semiconductor light receiving device, and wherein a distance between a light receiving surface of the semiconductor light receiving device and the component mounting surface is larger than a distance between the light emitting surface of the semiconductor light emitting device and the component mounting surface.

14. The light emitting module according to claim 13, wherein the reflecting film demonstrates a reflectance of not less than 5%.

15. The light emitting module according to claim 14, wherein the reflecting film further demonstrates the reflectance of not more than 30%.

16. The light emitting module according to claim 13, wherein the lens is a ball lens.

17. The light emitting module according to claim 17, wherein the semiconductor light emitting device has a luminescence intensity profile having a peak intensity at a predetermined angle inclined to an optical axis of the semiconductor light emitting device.

18. The light emitting module according to claim 13, wherein the semiconductor light receiving device comprises a semiconductor chip with a hole extending in the direction of the predetermined axis, and a light receiving portion provided in the semiconductor chip and along a closed curve surrounding the predetermined axis, and wherein the semiconductor light emitting device is housed in the hole of the semiconductor light receiving device.

* * * * *